US009514799B2

(12) United States Patent
Wang et al.

(10) Patent No.: US 9,514,799 B2
(45) Date of Patent: Dec. 6, 2016

(54) MEMORY SCHEDULING METHOD AND MEMORY CONTROLLER

(71) Applicant: Huawei Technologies Co., Ltd., Shenzhen (CN)

(72) Inventors: Xinyuan Wang, Beijing (CN); Haoyu Song, Santa Clara, CA (US)

(73) Assignee: Huawei Technologies Co., Ltd., Shenzhen (CN)

( * ) Notice: Subject to any disclaimer, the term of this patent is extended or adjusted under 35 U.S.C. 154(b) by 176 days.

(21) Appl. No.: 14/538,095

(22) Filed: Nov. 11, 2014

(65) Prior Publication Data

US 2015/0067249 A1   Mar. 5, 2015

Related U.S. Application Data

(63) Continuation of application No. PCT/CN2012/075433, filed on May 14, 2012.

(51) Int. Cl.
| | |
|---|---|
| G06F 12/00 | (2006.01) |
| G06F 13/00 | (2006.01) |
| G11C 11/406 | (2006.01) |
| G06F 13/16 | (2006.01) |

(52) U.S. Cl.
CPC ..... G11C 11/40615 (2013.01); G06F 13/1689 (2013.01)

(58) Field of Classification Search
None
See application file for complete search history.

(56) References Cited

U.S. PATENT DOCUMENTS

| | | | |
|---|---|---|---|
| 5,684,978 A | 11/1997 | Sarma et al. | |
| 5,765,182 A | 6/1998 | Lau et al. | |
| 6,532,523 B1 * | 3/2003 | Mogili | G06F 13/161 |
| | | | 711/167 |
| 7,089,369 B2 | 8/2006 | Emberling | |
| 7,158,438 B2 | 1/2007 | Kuo et al. | |
| 7,543,102 B2 | 6/2009 | Jacob et al. | |
| 2006/0158214 A1 * | 7/2006 | Janzen | G11C 7/1051 |
| | | | 326/30 |

(Continued)

FOREIGN PATENT DOCUMENTS

| | | |
|---|---|---|
| CN | 1859282 A | 11/2006 |
| CN | 101667105 A | 3/2010 |
| WO | 2008154625 A2 | 12/2008 |

*Primary Examiner* — Sean D Rossiter
(74) *Attorney, Agent, or Firm* — Slater Matsil, LLP

(57) ABSTRACT

In a memory scheduling method, a memory controller writes a first group of first row strobe commands (ACTs) into a first memory. The first group of first ACTs includes multiple first ACTs and a periodic interval exists between two adjacent first ACTs written by the memory controller into the first memory. The memory controller writes operation commands that correspond to the first group of first ACTs into the first memory after writing the first group of first ACTs into the first memory. The memory controller writes second ACTs into a second memory in periodic intervals for writing the first group of first ACTs into the first memory and/or in periodic intervals for writing the operation commands that correspond to the first group of first ACTs. The memory controller writes operation commands that correspond to the second ACTs into the second memory.

38 Claims, 10 Drawing Sheets

(56) References Cited

U.S. PATENT DOCUMENTS

| | | | |
|---|---|---|---|
| 2007/0162715 A1* | 7/2007 | Tagawa | G06F 13/1647 711/158 |
| 2010/0067278 A1* | 3/2010 | Oh | G11C 5/04 365/51 |
| 2010/0077140 A1* | 3/2010 | Abraham | G06F 13/1626 711/106 |
| 2013/0033954 A1* | 2/2013 | Shaeffer | G11C 5/04 365/230.03 |
| 2013/0086334 A1* | 4/2013 | Schuetz | G06F 13/1684 711/154 |
| 2014/0064009 A1* | 3/2014 | Lee | G11C 11/40611 365/222 |

* cited by examiner

MEMORY SCHEDULING METHOD AND MEMORY CONTROLLER

This application is a continuation of International Application No. PCT/CN2012/075433, filed on May 14, 2012, which is hereby incorporated by reference in its entirety.

TECHNICAL FIELD

The present invention relates to the information storage field and, in particular embodiments, to a memory scheduling method and a memory controller.

BACKGROUND

Currently, a random access of a memory controller to a dynamic random access memory (DRAM) is affected by inherent parameters (see Table 1) of the DRAM. A periodic interval exists between written commands. This periodic interval, however, causes a bus to be idle.

TABLE 1

| Parameter | Description | Influence | DDR3-1600 Parameter Value |
|---|---|---|---|
| CL | Clock period from sending an RD/RDAP command in a DRAM to outputting data | Read delay | 11 cycles |
| AL | Periodic interval from sending an RD/RDAP command or WR/WRAP command on a DRAM bus until the command is valid in the interior | Improvement of command bus utilization | May be set to 0, CL-1, or CL-2 |
| tRC | ACT-to-ACT periodic interval for access different Rows in a Bank | Performance of random access in a Bank | 48.75 ns |
| tRRD | ACT-to-ACT periodic interval between different Banks | Performance of random access at the time of Bank interleaving | 7.5 ns |
| tFAW | Four consecutive ACT command windows | Performance of random access at the time of Bank interleaving | 40 ns |
| tRTP | RD/RDAP-to-PRECHARGE periodic interval | Periodic interval from a read operation to a next random access in a Bank | 7.5 ns |
| tWR | Write recovery period | Periodic interval from a write operation to a next random access in a Bank | 15 ns |
| tRP | PRECHARGE period | Periodic interval from a read/write operation to a next random access in a Bank | 13.75 ns |
| tWTR | Periodic interval from receiving an internal write command to receiving an internal read command | Write-to-read delay | 7.5 ns |

Existing hardware architecture for implementing an access to a DRAM includes a memory controller and two X16 DDR3 memories (SDRAM, Synchronous Dynamic Random Access Memory). The two X16 DDR3 SDRAMs physically share address/command (ADDR/CMD) bus signals, and perform time-division multiplexing on ADDR/CMD bus signals in terms of a time sequence; each X16 DDR3 SDRAM uses an independent chip selection signal; and the input/output (IO) and data strobe (DQS) signals of each X16 DDR3 SDRAM are connected in "point-to-point" mode to the controller.

Based on the existing hardware architecture, a method for accessing a DRAM is generally as follows. A memory controller writes a row strobe command (ACT, ACTIVE) and a corresponding write operation command or read operation command into the DRAM, and then writes an ACT and a corresponding write operation command or read operation command, which are repeated to implement an access to the DRAM. An ACT command is a row strobe command of a DRAM. Its function is to activate a bank (Bank) in the DRAM, so as to write a read command or a write command into the activated Bank. Due to the existence of inherent parameters of a DRAM, a certain periodic interval exists between commands. This periodic interval, however, causes a bus to be idle. An example is taken for illustration in the following.

For example, a DRAM of a network device is used to implement a table lookup (Table lookup) function. Because a lookup table is composed of several lookup entries, for a random access to preceding and following entries, a situation that different rows (Row) of the same Bank of the DRAM are searched may occur, which is limited by a tRC, leaving multiple idle clock periods between lookup commands of the two entries.

To improve DRAM bandwidth utilization, generally, a lookup table is duplicated to multiple Banks and a next Bank is switched to after each entry lookup, so as to avoid the occurrence of the tRC by consecutively accessing multiple Banks. Because a row strobe command (ACT) needs to be sent for each lookup, a method of using multiple Banks to duplicate a lookup table and consecutively accessing multiple Banks will bring the tRRD and tFAW, although the tRC may be avoided.

If a DRAM is used as a packet buffer, generally a method of "multi-Bank rotary writing+multi-Bank rotary reading" is used to utilize the tRC and reduce a "read-to-write" idle period and a "write-to-read" idle period. However, as the working frequency increases, to avoid an influence brought by the tRRD and tFAW, the length of each Bank needs to be increased, causing a decrease in memory utilization when a memory stores messages. In addition, because of being affected by the CL and tWTR, a "write-to-read" idle period will be greatly increased, lowering the bandwidth utilization of the DRAM.

When the dominant frequency of a DRAM granule is improved to a DDR3-2133 or a DDR4 component of a higher frequency, the tWTR and CL will increase to more DRAM clock periods, causing even lower DRAM bandwidth utilization. In addition, to meet the tRRD and tFAW parameters, each cell needs to be configured to a larger size, for example, is configured to a size of three burst lengths (BL, Burst Length) or four BL8s. When the size of a Cell is three BL8s, for each X16 DDR3 SDRAM component, each BL8 is 32 bytes (Bytes), so that each Cell is 96 Bytes. Generally, each Cell can only be used to store one message. When a Cell fails to store one message, multiple Cells may store one message. For a message of 64 Bytes, one Cell needs to be allocated to store the message. In this case, the utilization of a DRAM is only 66.7% (64/96), forming a so-called small cell "N+1" problem. The larger a Cell is, the severer the small cell "N+1" problem is, that is, the lower the utilization of a DRAM is.

Based on the current hardware architecture, the prior art fails to decouple an ACT from a corresponding operation command under the premise of guaranteeing the bandwidth utilization of a DRAM, and therefore fails to flexibly invoke a command and fails to further avoid an influence brought by inherent parameters of the DRAM. As a result, a memory bandwidth cannot be further improved.

SUMMARY

Embodiments of the present invention provide a memory scheduling method and a corresponding memory controller, which utilize an idle period occurring during an access to a memory of the same Rank to access a memory of another Rank by configuring multiple ranks (Rank) of a memory, so that an ACT and a corresponding operation command can be flexibly invoked, improving bandwidth utilization of a DRAM.

A memory scheduling method is disclosed. A memory controller writes a first group of first row strobe commands (ACTs) into a first memory. The first group of first ACTs includes multiple first ACTs and a periodic interval exists between two adjacent first ACTs written by the memory controller into the first memory. The memory controller writes operation commands that correspond to the first group of first ACTs into the first memory after writing the first group of first ACTs into the first memory. A periodic interval exists between two adjacent operation commands written by the memory controller into the first memory. The memory controller writes second ACTs into a second memory in periodic intervals for writing the first group of first ACTs into the first memory and/or in periodic intervals for writing the operation commands that correspond to the first group of first ACTs into the first memory. The memory controller writes operation commands that correspond to the second ACTs into the second memory. The first memory and the second memory are configured with dual Ranks.

A memory controller includes a number of units. A first row strobe unit is configured to write a first group of first ACTs into a first memory. The first group of first ACTs includes multiple first ACTs and a periodic interval exists between two adjacent first ACTs written into the first memory. A first read and write unit is configured to write operation commands that correspond to the first group of first ACTs into the first memory after the first row strobe unit writes the first group of first ACTs into the first memory. A periodic interval exists between two adjacent operation commands written into the first memory. A second row strobe unit is configured to write second ACTs into a second memory in periodic intervals for writing, by the first row strobe unit, the first group of first ACTs into the first memory and/or in periodic intervals for writing, by the first read and write unit, the operation commands that correspond to the first group of first ACTs into the first memory. The first memory and the second memory are configured with dual Ranks. A second read and write unit is configured to write operation commands that correspond to the second ACTs into the second memory.

The present invention has a number of advantages.

An idle period occurring during an access to a memory of the same Rank is utilized to access a memory of another Rank, thereby improving bandwidth utilization of a DRAM.

Memory commands of different Ranks are written between an ACT command and a corresponding operation command, an ACT command is decoupled from a corresponding operation command, and flexible scheduling of an operation command is implemented.

Technical solutions of the present invention are slightly affected by parameters such as a tRRD and tFAW. When a working frequency of a DRAM increases, a cell does not need to be enlarged, thereby alleviating a small cell "N+1" problem.

DETAILED DESCRIPTION OF ILLUSTRATIVE EMBODIMENTS

An embodiment of the present invention provides a memory scheduling method, and embodiments of the present invention further provide a corresponding memory controller and system, which are respectively described in detail as follows.

Embodiment 1

Figure 1:
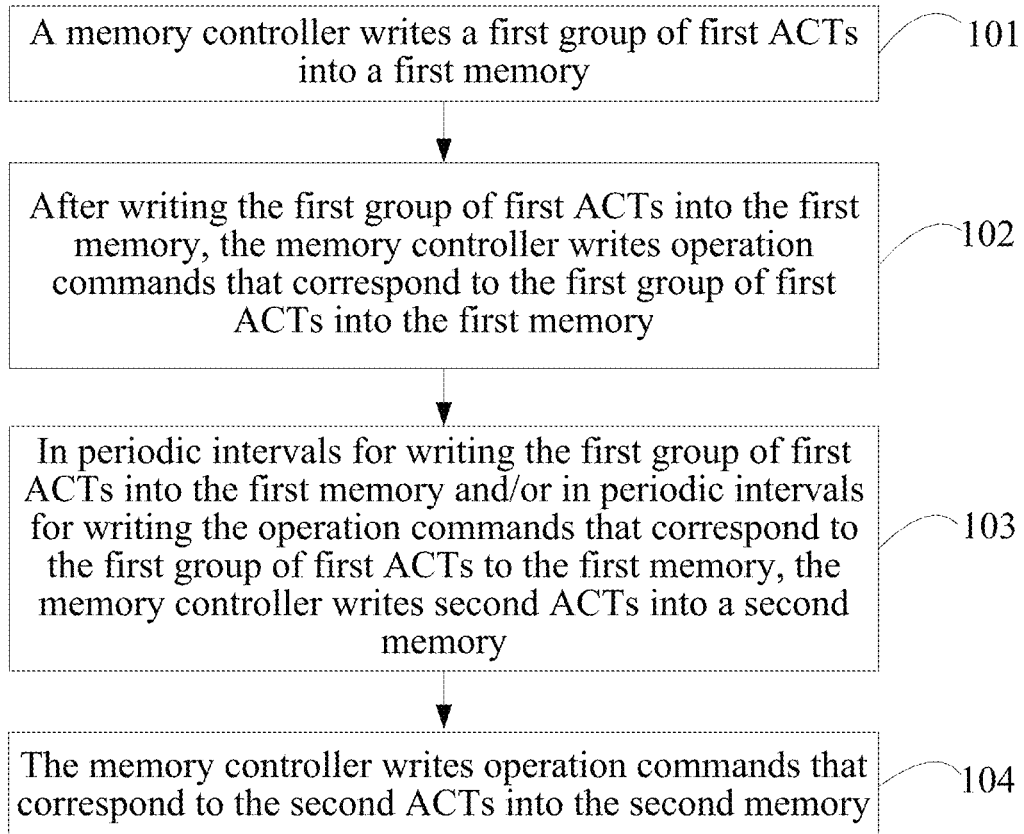
FIG. 1 is a flowchart of a memory scheduling method according to Embodiment 1.

As shown in FIG. 1, a memory scheduling method includes the following steps.

101. A memory controller writes a first group of first ACTs into a first memory, where the first group of first ACTs includes multiple first ACTs, and a periodic interval exists between two adjacent first ACTs written by the memory controller into the first memory.

102. After writing the first group of first ACTs into the first memory, the memory controller writes operation commands that correspond to the first group of first ACTs into the first memory, where a periodic interval exists between two adjacent operation commands written by the memory controller into the first memory.

103. In periodic intervals for writing the first group of first ACTs into the first memory and/or in periodic intervals for writing the operation commands that correspond to the first group of first ACTs into the first memory, the memory controller writes second ACTs into a second memory.

A periodic interval exists between two adjacent second ACTs written by the memory controller into the second memory. The periodic intervals for writing the first group of first ACTs into the first memory are periodic intervals between every adjacent first ACTs written by the memory controller into the first memory. The periodic intervals for writing the operation commands that correspond to the first group of first ACTs into the first memory are periodic intervals between every adjacent operation commands written by the memory controller into the first memory.

In other words, in idle periods of writing the first group of first ACTs and the operation commands that correspond to the first group of first ACTs into the first memory, the memory controller may write the second ACTs into the second memory. The idle periods are periodic intervals for writing, by the memory controller, adjacent commands into a memory. The idle periods include intervals such as a tRRD, tFAW, and tRP.

The first memory and the second memory are configured with dual Ranks.

It should be noted that, an interval for accessing, by the memory controller, adjacent ACTs of the same Rank memory is larger than an inherent parameter tRC interval, and an interval for accessing every four ACTs of the same Rank memory is larger than an inherent parameter tFAW interval. This is also a limitation of inherent parameters of a memory to memory invocation.

Figure 2:
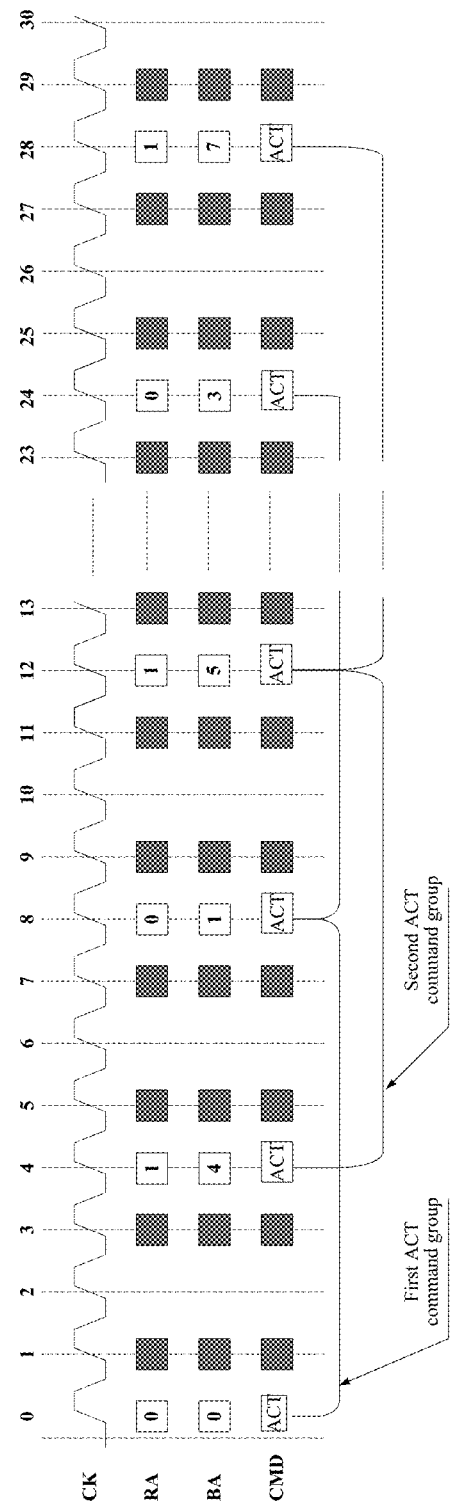
FIG. 2 is a schematic diagram of a time sequence of a memory scheduling method.

As shown in FIG. 2, a command group Rank0 ACT set of the first memory and a command group Rank1 ACT set of the second memory are scheduled in interleaved mode, and Rank1 ACTs are written into the second memory in a periodic interval of Rank0 ACTs.

The first memory and the second memory belong to different Ranks. The first memory belongs to Rank0, and the second memory belongs to Rank1. There is no coupling relationship between writing a command into the first memory and writing a command into the second memory. Therefore, an idle period when commands are written into the first memory may be utilized to write any command into the second memory. This provides great flexibility for the memory controller to invoke a memory and reduces an idle period of a bus.

104. The memory controller writes operation commands that correspond to the second ACTs into the second memory, where a periodic interval exists between two adjacent operation commands written by the memory controller into the second memory.

Due to the existence of inherent parameters of a DRAM, a certain periodic interval exists between commands. This periodic interval, however, causes a bus to be idle. The present invention uses a periodic interval between commands to write commands into different memories.

Embodiment 2

Figure 3:
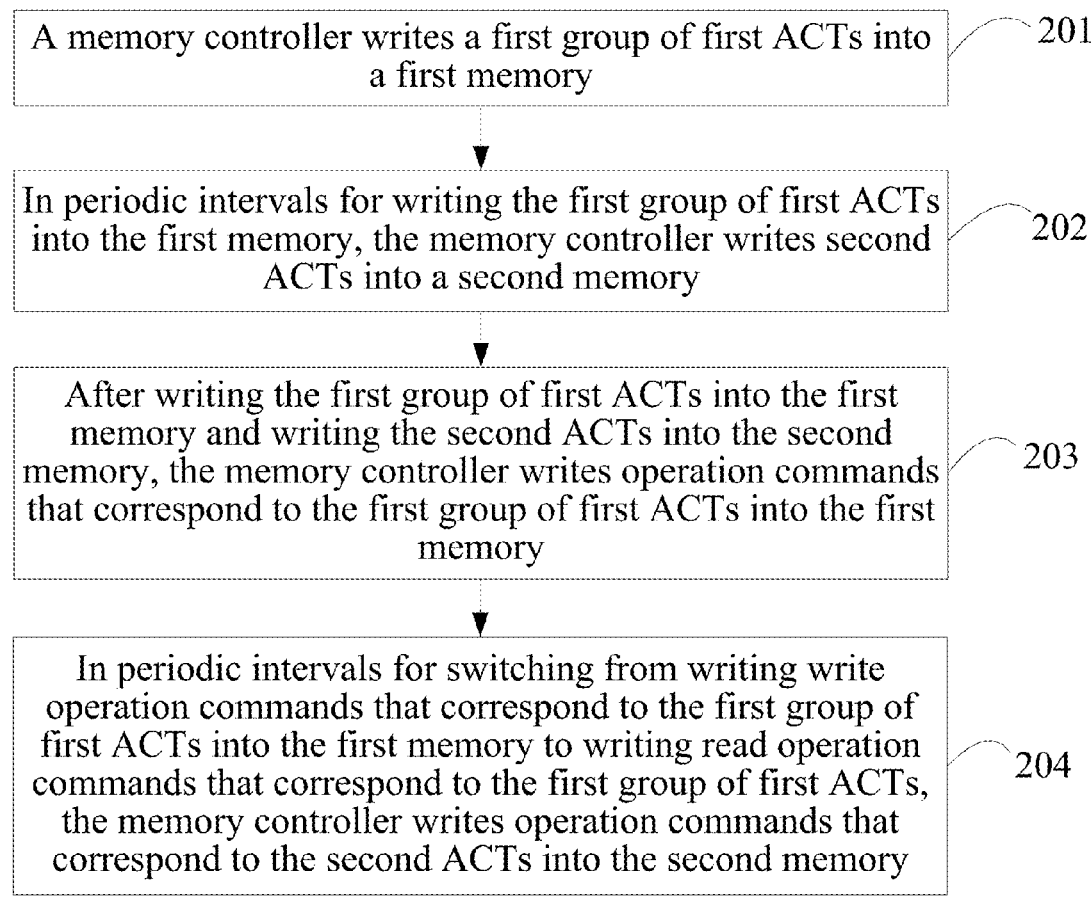
FIG. 3 is a flowchart of a memory scheduling method according to Embodiment 2.

As shown in FIG. 3, a memory scheduling method includes the following steps.

201. A memory controller writes a first group of first ACTs into a first memory, where the first group of first ACTs includes multiple first ACTs, and a periodic interval exists between two adjacent first ACTs written by the memory controller into the first memory.

202. In periodic intervals for writing the first group of first ACTs into the first memory, the memory controller writes second ACTs into a second memory, where a periodic interval exists between two adjacent second ACTs written by the memory controller into the second memory.

The first memory and the second memory are configured with dual Ranks.

An interval for accessing, by the memory controller, adjacent ACTs of the first memory is larger than an inherent parameter tRC interval. The memory controller may utilize a periodic interval (a tRRD or tFaw) between adjacent first ACTs to write the second ACTs into the second memory, so as to avoid that the periodic interval is idle.

203. After writing the first group of first ACTs into the first memory and writing the second ACTs into the second memory, the memory controller writes operation commands that correspond to the first group of first ACTs into the first memory.

Because the second ACTs are written in periodic intervals between adjacent first ACTs, the memory controller may not consecutively schedule the first ACTs and operation commands that correspond to the first ACTs but may utilize a periodic interval between adjacent first ACTs.

Preferably, the writing, by the memory controller, the operation commands that correspond to the first group of first ACTs into the first memory is specifically as follows: The memory controller writes write operation commands that correspond to the first group of first ACTs into the first memory; and after the memory controller writes the write operation commands that correspond to the first group of first ACTs into the first memory, the memory controller writes read operation commands that correspond to the first group of first ACTs into the first memory.

204. In periodic intervals for switching from writing write operation commands that correspond to the first group of first ACTs into the first memory to writing read operation commands that correspond to the first group of first ACTs, the memory controller writes operation commands that correspond to the second ACTs into the second memory. It can be seen that, this step utilizes a periodic interval from a write command to a read command, that is, utilizes a clock period of a tWTR and CL to write the operation commands that correspond to the second ACTs into the second memory.

Figure 4:
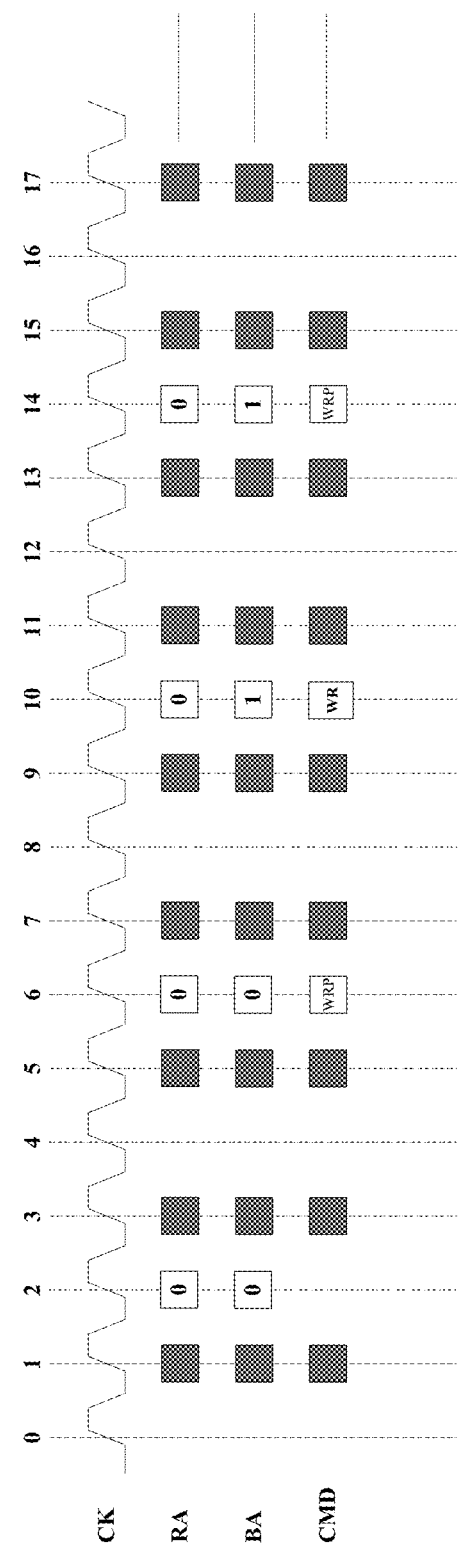
FIG. 4 is a schematic diagram of a time sequence of write commands.

Preferably, the operation commands are read operation commands or write operation commands, where the read operation commands include read commands (RD) and read commands (RDAP) that have implicit row charging commands, and the write operation commands include write commands (WR) and write commands (WRAP) that have implicit row charging commands. As shown in FIG. 4, one write operation command includes one WR and one WRAP, and a periodic interval exists between a WR and a WRAP that are adjacent to each other. Likewise, one read operation command includes one RD and one RDAP, and a periodic interval exists between an RD and an RDAP that are adjacent to each other.

Generally, one ACT corresponds to one RD and RDAP, or one ACT corresponds to a WR and WRAP. Therefore, the operation commands that correspond to the first ACTs are RDs and RDAPs, or WRs and WRAPs. The first ACTs include multiple first ACTs. Then operation commands that correspond to the multiple first ACTs may be RDs and RDAPs, or WRs and WRAPs. Operation commands that correspond to a part of the first ACTs may also be RDs and RDAPs, and operation commands that correspond to a part of the first ACTs may be WRs and WRAPs.

Preferably, the writing, by the memory controller, the first group of first ACTs into the first memory is specifically as follows. The memory controller writes first ACTs into different Banks of the first memory.

Preferably, the writing, by the memory controller, the second ACTs into the second memory is specifically as follows: The memory controller writes the second ACTs into different Banks of the second memory.

The writing, by the memory controller, the first ACTs into different banks of the first memory, and the writing the second ACTs into different Banks of the second memory may avoid the occurrence of an idle period of the tRC and improve bus utilization.

The following steps take place in Embodiment 2.

The writing, by the memory controller, the first group of first ACTs into the first memory is specifically as follows. The memory controller writes multiple groups of first ACTs into the first memory, where each group of first ACTs contains at least one first ACT, the multiple groups of first ACTs include the first group of first ACTs and a second group of first ACTs, and the first group of first ACTs and the second group of first ACTs are written one after another into the first memory. Preferably, each group of first ACTs contains four first ACTs, an interval between the first group of first ACTs and the second group of first ACTs needs to be larger than the tFAW when the first group of first ACTs and the second group of first ACTs are written one after another into the first memory, and a command may be written into the second memory in this interval. In addition, this embodiment may be not limited to writing a command to the second memory, and a command may be further written into a third memory.

The writing, by the memory controller, the operation commands that correspond to the first ACTs into the first memory is specifically as follows: The memory controller writes WRs and WRAPs that correspond to the first group of first ACTs into the first memory, and the memory controller writes RDs and RDAPs that correspond to the second group of first ACTs into the first memory.

In periodic intervals for switching from writing the write operation commands that correspond to the first ACTs into the first memory to writing the read operation commands that correspond to the first ACTs, the memory controller writes the operation commands that correspond to the second ACTs into the second memory, so as to utilize a clock period of the tWTR and CL to perform a read or write access to the second memory.

Embodiment 3

Figure 5:
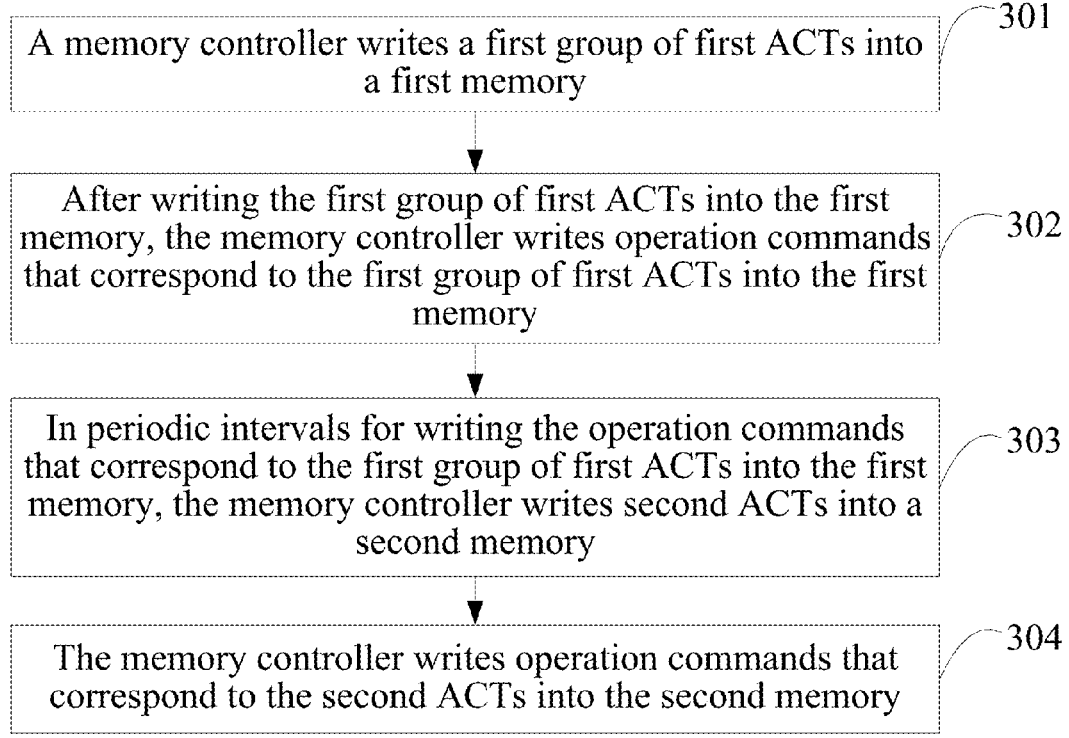
FIG. 5 is a flowchart of a memory scheduling method according to Embodiment 3.

As shown in FIG. 5, a memory scheduling method includes the following steps.

301. A memory controller writes a first group of first ACTs into a first memory, where the first group of first ACTs includes multiple first ACTs, and a periodic interval exists between two adjacent first ACTs written by the memory controller into the first memory.

302. After writing the first group of first ACTs into the first memory, the memory controller writes operation commands that correspond to the first group of first ACTs into the first memory, where a periodic interval exists between two adjacent operation commands written by the memory controller into the first memory.

303. In periodic intervals for writing the operation commands that correspond to the first group of first ACTs into the first memory, the memory controller writes second ACTs into a second memory. This step utilizes a periodic interval between two adjacent operation commands that correspond to the first ACTs, and reduces an idle period of a bus. For example, if operation commands that correspond to one first ACT are an RD and RDAP, one second ACT may be written into the second memory in a periodic interval between the RD and RDAP; and if operation commands that correspond to one first ACT are a WR and WRAP, one second ACT may be written into the second memory in a periodic interval between the WR and WRAP.

The first memory and the second memory are configured with dual Ranks.

304. The memory controller writes operation commands that correspond to the second ACTs into the second memory.

Embodiment 4

Figure 6:
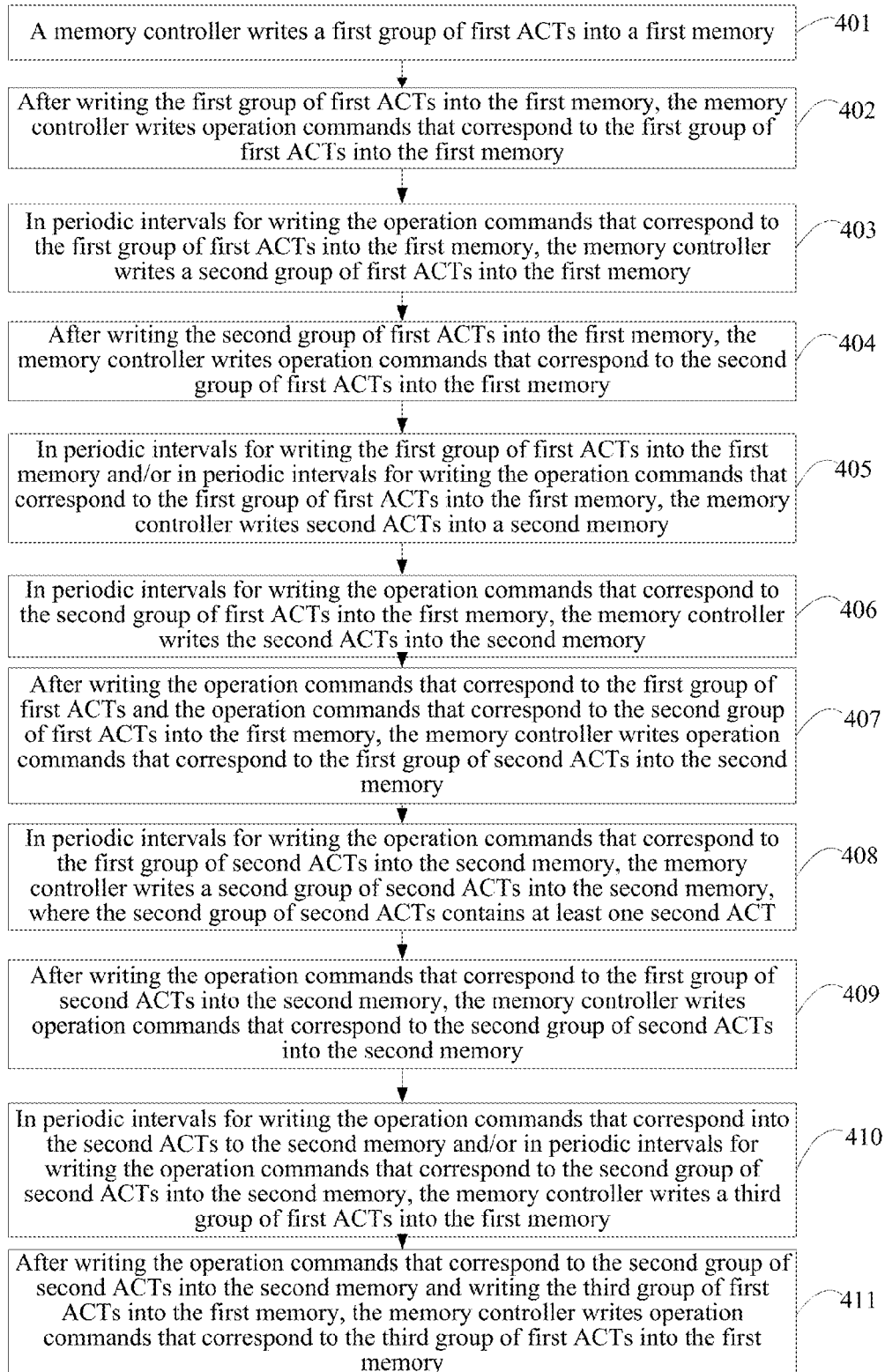
FIG. 6 is a flowchart of a memory scheduling method according to Embodiment 4.

As shown in FIG. 6, a memory scheduling method includes the following steps.

401. A memory controller writes a first group of first ACTs into a first memory, where the first group of first ACTs includes multiple first ACTs, and a periodic interval exists between two adjacent first ACTs written by the memory controller into the first memory.

402. After writing the first group of first ACTs into the first memory, the memory controller writes operation commands that correspond to the first group of first ACTs into the first memory, where a periodic interval exists between two adjacent operation commands written by the memory controller into the first memory.

403. In periodic intervals for writing the operation commands that correspond to the first group of first ACTs into the first memory, the memory controller writes a second group of first ACTs into the first memory, where the second group of first ACTs includes multiple first ACTs. In this way, periodic intervals of the operation commands that correspond to the first group of ACTs are utilized to reduce an idle period of a bus.

404. After writing the second group of first ACTs into the first memory, the memory controller writes operation commands that correspond to the second group of first ACTs into the first memory.

405. In periodic intervals for writing the first group of first ACTs into the first memory and/or in periodic intervals for writing the operation commands that correspond to the first group of first ACTs into the first memory, the memory controller writes second ACTs into a second memory.

The method according to this embodiment further includes the following steps.

406. Preferably, in periodic intervals for writing the operation commands that correspond to the second group of first ACTs into the first memory, the memory controller writes the second ACTs into the second memory.

Preferably, the first group of first ACTs and the second group of first ACTs respectively contain four first ACTs.

Preferably, the writing, by the memory controller, the second ACTs into the second memory is specifically as follows: In periodic intervals for writing the operation commands that correspond to the first group of first ACTs into the first memory and/or in periodic intervals for writing the operation commands that correspond to the second group of first ACTs into the first memory, the memory controller writes a first group of second ACTs into the second memory, where the first group of second ACTs contains at least one second ACT.

This step utilizes a periodic interval between two adjacent operation commands that correspond to the first ACTs, and reduces an idle period of a bus. For example, if operation commands that correspond to one first ACT are a RD and RDAP, one second ACT may be written into the second memory in a periodic interval between the RD and RDAP; and if operation commands that correspond to one first ACT are a WR and WRAP, one second ACT may be written into the second memory in a periodic interval between the WR and WRAP.

Preferably, the first group of second ACTs contains four second ACTs.

It can be seen from above, in periodic intervals of the operation commands that correspond to the first group of first ACTs and/or the operation commands that correspond to the second group of first ACTs, the second group of first ACTs is written; and the first group of second ACTs is written into the second memory in periodic intervals of adjacent first ACTs of the second group. That is to say, in periodic intervals of the operation commands that correspond to the first group of first ACTs and/or the operation commands that correspond to the second group of first ACTs, the second group of first ACTs and the first group of second ACTs are written. This reduces an idle period of a bus to a great extent.

407. After writing the operation commands that correspond to the first group of first ACTs and the operation commands that correspond to the second group of first ACTs into the first memory, the memory controller writes operation commands that correspond to the first group of second ACTs into the second memory.

A common DRAM contains eight Banks. The memory controller consecutively and respectively writes the operation commands that correspond to the first group and the second group of first ACTs into the eight Banks, and then writes operation commands that correspond to the second ACTs into the second memory, so as to reduce switching between Rank0 and Rank1.

408. Preferably, in periodic intervals for writing the operation commands that correspond to the first group of second ACTs into the second memory, the memory controller writes a second group of second ACTs into the second memory, where the second group of second ACTs contains at least one second ACT. This step utilizes a periodic interval between two adjacent operation commands that correspond to the first group of second ACTs, and reduces an idle period of a bus.

Preferably, the first group of second ACTs contains four second ACTs, and the second group of second ACTs contains four second ACTs. The memory controller writes eight ACTs into the second memory, but a common DRAM contains eight Banks. Therefore, the memory controller may respectively write one ACT into different Banks.

409. Preferably, after writing the operation commands that correspond to the first group of second ACTs into the second memory, the memory controller writes operation commands that correspond to the second group of second ACTs into the second memory. It can be seen that, the memory controller may consecutively write eight operation commands into eight different Banks of the second memory. This reduces switching between different Ranks.

410. Preferably, in periodic intervals for writing the operation commands that correspond to the second ACTs into the second memory and/or in periodic intervals for writing the operation commands that correspond to the second group of second ACTs into the second memory, the memory controller writes a third group of first ACTs into the first memory, where the third group of first ACTs contains at least one first ACT.

Periodic intervals exist between operation commands that correspond to the same ACT, for example, four periodic intervals exist between an RD and RDAP that correspond to the same ACT, and four periodic intervals also exist between a WR and WRAP that correspond to the same ACT. Therefore, the third group of first ACTs may be written into the first memory by utilizing periodic intervals of the operation commands that correspond to the first group of second ACTs and periodic intervals of the operation commands that correspond to the second group of second ACTs.

Preferably, the third group contains four first ACTs.

411. Preferably, after writing the operation commands that correspond to the second group of second ACTs into the second memory and writing the third group of first ACTs into the first memory, the memory controller writes operation commands that correspond to the third group of first ACTs into the first memory. In combination with the foregoing steps, it can be seen that, in periodic intervals of the operation commands that correspond to the third group of first ACTs and the operation commands that correspond to the second group of first ACTs, the memory controller writes the operation commands that correspond to the first group and the second group of second ACTs into the second memory. That is to say, the periodic intervals are utilized to reduce an idle period of a bus.

Preferably, the foregoing first group of first ACTs, second group of first ACTs, third group of first ACTs, first group of second ACTs, and second group of second ACTs contain an equal number of ACT commands.

If the operation commands that correspond to the first group and the second group of first ACTs are write operation commands, and the operation commands that correspond to the third group of first ACTs are read operation commands, the periodic intervals include the time of inherent parameters tWTR and CL of a memory. Therefore, the time of the inherent parameters tWTR and CL of a memory is utilized. If the operation commands that correspond to the first group and the second group of first ACTs are read operation commands, the operation commands that correspond to the third group of first ACTs are read operation commands, and the operation commands that correspond to the first group and the second group of second ACTs are read operation commands, this embodiment may be applied for table lookup and the time of inherent parameters tRRD and tFAW may be utilized to write a command.

Figure 7:
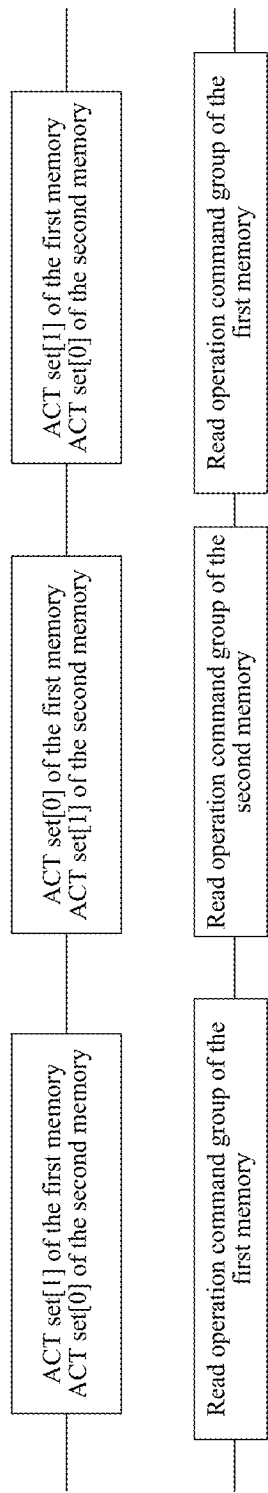
FIG. 7 is a schematic diagram of scheduling of row strobe command groups and read operation command groups in interleaved mode.

As shown in FIG. 7, Rank0 corresponds to the first memory, Rank1 corresponds to the second memory, an ACT set indicates an ACT command group, an RD set indicates a read operation command group, ACT set[0] contains four ACTs of Bank0 to Bank3, ACT set[1] contains four ACTs of Bank4 to Bank7, and an RD Set contains RD/RDAP commands of Bank0 to Bank7. In a period of writing a read operation command group Rank0 RD set to the first memory, ACT command groups Rank0 ACT set[1] and Rank1 ACT set[0] are written into the first memory, where the Rank0 RD set is a set of operation commands that correspond to Rank0 ACT set[0] and Rank0 ACT set[1]. In a period of writing a read operation command group Rank1 RD set into the second memory, Rank0 ACT set[0] and an ACT command group Rank1 ACT set[1] of the second memory are written, where the Rank1 RD set is a set of operation commands that correspond to Rank1 ACT set[0] and Rank0 ACT set[1]. As shown in FIG. 7, ACT sets and RD sets are written in interleaved mode into a memory, the time of the tRRD and tFAW is used to write an RD command, and a periodic interval between an RD and RDAP is used to write an ACT command. In this way, an idle period of the tRRD and tFAW is utilized, and two idle periods are added when there is only Rank switching on a bus, so that the bandwidth utilization of a DRAM is greatly improved. Obviously, to utilize the time of inherent parameters of a memory, such as tRRD, tFAW, and tRP, a periodic interval for writing two commands that are restricted by inherent parameters should be larger than or equal to the inherent parameters.

Figure 8:
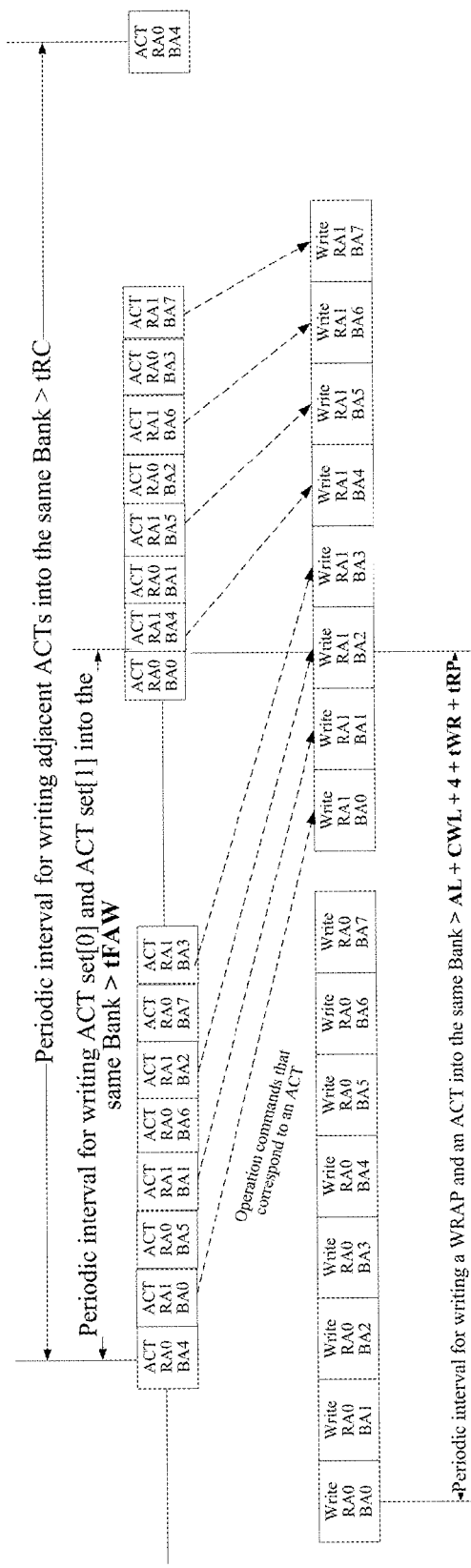
FIG. 8 is a schematic diagram of scheduling of row strobe command groups and write operation command groups in interleaved mode.

As shown in FIG. 8, ACT set[0] contains four ACTs of Bank0 to Bank3, ACT set[1] contains four ACTs of Bank4 to Bank7, RA is short for Rank, BA is short for Bank, and ACT RAx Bay means writing an ACT into a yth Bank of an xth memory. For example, ACT RA0 BA4 means writing an ACT into the fourth Bank of the first memory. Write RAx Bay means writing a write operation command to a yth Bank of an xth memory. For example, Write RA0 BA0 means writing a write operation command into the first Bank of the first memory. FIG. 8 reflects a corresponding relationship between each ACT and a write operation command as well as an interval of a command group. A periodic interval for writing a WRAP and an ACT into the same Bank should be larger than an interval restricted by inherent parameters of a memory, that is, AL+CWL+2×Rank switching time (four clock periods)+tWR+tRP; a periodic interval for writing an RDAP and an ACT into the same Bank should be larger than an interval restricted by inherent parameters of a memory, that is, AL+tRTP+Trp; a periodic interval for writing ACT set[0] and ACT set[1] into the same Bank should be larger than a tFAW; and a periodic interval for writing adjacent ACTs into the same Bank should be larger than a tRC.

According to a calculation, the bandwidth utilization of a DRAM is as follows (based on a DDR3-1600 component):

$$\text{Utilization} = 1 - \text{Idle period}/\text{Total period}$$
$$= 1 - (2+2)/(Rank0\ RD\ \text{Set cycles} + 2 + Rank1\ RD\ \text{Set cycles} + 2)$$
$$= 1 - 4/(40 + 2 + 40 + 2)$$
$$= 95.2\%$$

In addition, if a DRAM is upgraded from a DDR3-1600 to a DDR3-2133 or DDR4 component, the dominant frequency of a DRAM granule will be further improved but the tRRD and tFAW will only slightly decrease due to component principles and structural restrictions, and an increase in the dominant frequency still cannot change the tRRD and tFAW. In this embodiment, two ACT Sets of each Rank are respectively interleaved to RD Sets of two Ranks, greatly loosening restrictions of the tRRD and tFAW. The foregoing DRAM bandwidth utilization of 95.2% may also be obtained if a DDR3-2133 or DDR4-2400 component is used in this embodiment of the present invention.

Figure 9:
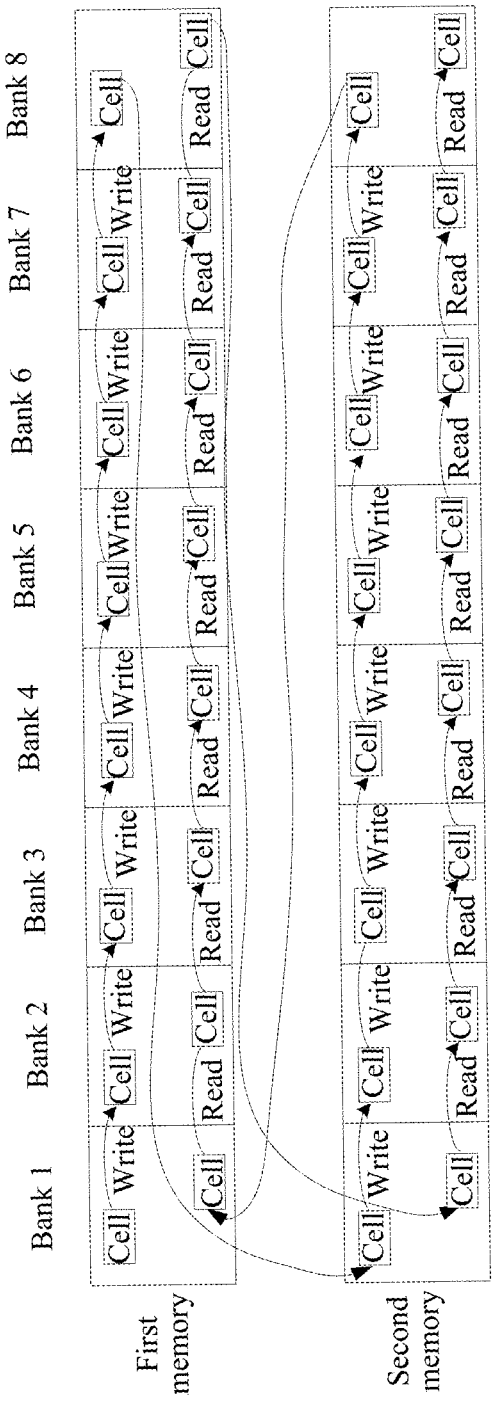
FIG. 9 is a schematic diagram of cell operations in a packet buffer.

As shown in FIG. 9, a technical solution of the present invention is adopted to perform operations on a cell (Cell) of a packet buffer (Packet buffer). Specifically, Rank0 corresponds to the first memory, Rank1 corresponds to the second memory, Rank0 and Rank1 are used as Packet Buffers, ACT set[0] contains four ACTs of Bank0 to Bank3, ACT set[1] contains four ACTs of Bank4 to Bank7, and an RD Set contains RD/RDAP commands of Bank0 to Bank7. Scheduling is performed repeatedly according to Rank0 WR Set→Rank1 WR Set→Rank0 RD Set→Rank1 RD Set. ACT Sets and WR Sets/RD Sets are mutually interleaved, a periodic interval of the tRRD and tFAW is utilized, and at the same time, a write operation or read operation of another Rank is written in a "write-to-read" periodic interval of one Rank, so that the time of the tWTR and CL can be utilized and two idle periods are added when there is only Rank switching on a bus, greatly improving the bandwidth utilization of a DRAM. The bandwidth utilization of a DRAM is as follows (without considering a bandwidth occupied for refreshing of the DRAM, and based on a DDR3-1600 component):

$$\text{Utilization} = 1 - \text{Idle period}/\text{Total period}$$
$$= 1 - (2+2+2+2)/(Rank0\ WR\ \text{Set cycles} + 2 + Rank1\ WR\ \text{Set cycles} + 2 + Rank0\ RD\ \text{Set cycles} + 2 + Rank1\ RD\ \text{Set cycles} + 2)$$
$$= 1 - 8/(64 + 2 + 64 + 2 + 64 + 2 + 64 + 2)\backslash$$
$$= 97.0\%$$

where, Rank0 WR Set cycles indicates a period for writing Rank0 WR Set, Rank1 WR Set cycles indicates a period for writing Rank1 WR Set, Rank0 RD Set cycles indicates a period for writing Rank0 RD Set, and Rank1 RD Set cycles indicates a period for writing Rank1 RD Set.

It should be noted that, the foregoing RDAP-to-ACT interval for accessing the same Bank memory is larger than the sum of intervals of inherent parameters AL, tRTP, and tRP, and a WRAP-to-ACP interval for accessing the same Bank is larger than the sum of inherent parameters AL, CL, tWR, and tRP. This is also a time limitation of inherent parameters of a memory itself on memory invocation. Obviously, in the method of the present invention, these time intervals are skillfully utilized to write commands to memories that belong to different Ranks, thereby improving memory bandwidth utilization.

In addition, if a DRAM is upgraded from a DDR3-1600 to a DDR3-2133 or DDR4 component, the dominant frequency of a DRAM granule will be further improved and intervals of parameters such as the tWTR and CL of the DRAM will be significantly increased, but an influence brought by parameters the tWTR and CL may be eliminated because a sufficiently long read or write operation of another Rank may be inserted during read-write switching of the same Rank.

In this embodiment, the foregoing DRAM bandwidth utilization of 97.0% can also be obtained by using a DDR3-2133 or DDR4-2400 component, and a cell of a Packet Buffer will not grow and a small cell "N+1" problem will not worsen when a component of a higher rate is used.

A memory controller for implementing the foregoing method is described in the following.

Embodiment 5

Figure 10:
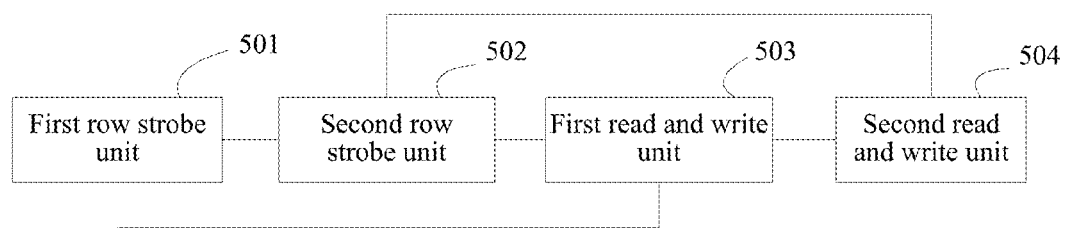
FIG. 10 is a logical structural diagram of a memory controller.

As shown in FIG. 10, a memory controller includes a number of units. A first row strobe unit 501 is configured to write a first group of first ACTs into a first memory, where the first group of first ACTs includes multiple first ACTs and a periodic interval exists between two adjacent first ACTs written into the first memory. A first read and write unit 502 is configured to write operation commands that correspond to the first group of first ACTs into the first memory after the first row strobe unit writes the first group of first ACTs into the first memory. A periodic interval exists between two adjacent operation commands written into the first memory. A second row strobe unit 503 is configured to write second ACTs into a second memory in periodic intervals for writing, by the first row strobe unit 501, the first group of first ACTs into the first memory and/or in periodic intervals for writing, by the first read and write unit, the operation commands that correspond to the first group of first ACTs into the first memory, where a periodic interval exists between two adjacent second ACTs written into the second memory and the first memory and the second memory are configured with dual Ranks.

A second read and write unit 504 is configured to write operation commands that correspond to the second ACTs into the second memory. Specifically, after the second row strobe unit 503 writes the second ACTs into the second memory. The second read and write unit writes the operation commands that correspond to the second ACTs into the second memory. A periodic interval exists between two adjacent operation commands written into the second memory.

The first memory and the second memory belong to different Ranks. The first memory belongs to Rank0, and the second memory belongs to Rank1. There is no coupling relationship when commands are written. Therefore, in an idle period of writing, by the first row strobe unit and the first read and write unit, a command into the first memory, the second row strobe unit may write an ACT command into the second memory. This provides great flexibility for the memory controller to invoke a memory and reduces an idle period of a bus.

Preferably, the operation commands are read operation commands or write operation commands, where the read operation commands include read commands RD and read commands RDAP that have implicit row charging commands, and the write operation commands include write commands WR and write commands WRAP that have implicit row charging commands.

Preferably, the first read and write unit is further configured to write the first ACTs into different banks Bank of the first memory.

Preferably, the second read and write unit is further configured to write the second ACTs into different Banks of the second memory.

Embodiment 6

A memory controller includes a number of units. A first row strobe unit is configured to write a first group of first ACTs into a first memory. The first group of first ACTs includes multiple first ACTs and a periodic interval exists between two adjacent first ACTs written into the first memory. A first read and write unit is configured to write operation commands that correspond to the first group of first ACTs into the first memory after the first row strobe unit writes the first group of first ACTs into the first memory. A periodic interval exists between two adjacent operation commands written into the first memory and specifically, after the first row strobe unit writes the first ACTs into the first memory, the first read and write unit writes operation commands that correspond to the first ACTs into the first memory.

A second row strobe unit is configured to write second ACTs into a second memory in periodic intervals for writing, by the first row strobe unit, the first group of first ACTs into the first memory, where the first memory and the second memory are configured with dual Ranks and a periodic interval exists between two adjacent second ACTs written into the second memory. A second read and write unit is configured to write operation commands that correspond to the second ACTs into the second memory. Specifically, after the second row strobe unit writes the second ACTs into the second memory, the second read and write unit writes the operation commands that correspond to the second ACTs into the second memory, where a periodic interval exists between two adjacent operation commands written into the second memory.

The first memory and the second memory belong to different Ranks. The first memory belongs to Rank0, and the second memory belongs to Rank1. There is no coupling relationship when commands are written. Therefore, in an idle period of writing, by the first row strobe unit, a first ACT command into the first memory, the second row strobe unit may write a second ACT command into the second memory. The first read and write unit writes the operation commands that correspond to the first ACTs into the first memory after the second row strobe unit writes the second ACT command into the second memory. The operation commands that correspond to the first ACTs are not immediately written into the first memory following the first ACTs. This provides great flexibility for the memory controller to invoke a memory and reduces an idle period of a bus.

Preferably, the operation commands are read operation commands or write operation commands, where the read operation commands include read commands RD and read commands RDAP that have implicit row charging commands, and the write operation commands include write commands WR and write commands WRAP that have implicit row charging commands.

Preferably, the first read and write unit is further configured to write the first ACTs into different banks Bank of the first memory.

Preferably, the second read and write unit is further configured to write the second ACTs into different Banks of the second memory.

Preferably, the first read and write unit is further configured to write the operation commands that correspond to the first group of first ACTs into the first memory after the first row strobe unit writes the first group of first ACTs into the first memory and the second row strobe unit writes the second ACTs into the second memory.

Preferably, the first read and write unit includes a first read unit and a first write unit, where the first write unit is configured to write write operation commands that correspond to the first group of first ACTs into the first memory; and the first read unit is configured to write read operation commands that correspond to the first group of first ACTs into the first memory after the first write unit writes the write operation commands that correspond to the first group of first ACTs into the first memory.

Preferably, the second read and write unit is further configured to write the operation commands that correspond to the second ACTs into the second memory in periodic intervals of switching from the writing, by the first write unit, the write operation commands that correspond to the first group of first ACTs into the first memory to the writing, by the first read unit, the read operation commands that correspond to the first group of first ACTs into the first memory.

It can be seen from above, the first read and write unit and the second read and write unit write the operation commands that correspond to the first ACTs and the operation commands that correspond to the second ACTs after the first row strobe unit and the second row strobe unit write the first ACTs and the second ACTs respectively into the first memory and the second memory. The second read and write unit utilizes a write-to-read periodic interval tWTR of the first read and write unit and a CL to perform read and write operations.

Embodiment 7

A memory controller includes. A first row strobe unit is configured to write a first group of first ACTs into a first memory. The first group of first ACTs includes multiple first ACTs and a periodic interval exists between two adjacent first ACTs written into the first memory. A first read and write unit is configured to write operation commands that correspond to the first group of first ACTs into the first memory after the first row strobe unit writes the first group of first ACTs into the first memory. A periodic interval exists between two adjacent operation commands written into the first memory. A second row strobe unit is configured to write second ACTs into a second memory in periodic intervals for writing, by the first read and write unit, the operation commands that correspond to the first group of first ACTs into the first memory, where the first memory and the second memory are configured with dual Ranks and a periodic interval exists between two adjacent second ACTs written into the second memory. A second read and write unit is configured to write operation commands that correspond to the second ACTs into the second memory. Specifically, after the second row strobe unit writes the second ACTs into the second memory, the second read and write unit writes the operation commands that correspond to the second ACTs into the second memory, where a periodic interval exists between two adjacent operation commands written into the second memory.

The first memory and the second memory belong to different Ranks. The first memory belongs to Rank0, and the second memory belongs to Rank1. There is no coupling relationship when commands are written. Therefore, the second row strobe unit may write the second ACTs into the second memory in an idle period of writing, by the first row strobe unit, operation commands that correspond to first ACT commands into the first memory, and the second read and write unit utilizes an idle period of the operation commands that correspond to the first ACT commands to perform an operation, reducing an idle period of a bus.

Preferably, the first row strobe unit is further configured to write a second group of first ACTs into the first memory in periodic intervals for writing the operation commands that correspond to the first group of first ACTs into the first memory, where the second group of first ACTs contains multiple first ACTs.

The first read and write unit is further configured to write operation commands that correspond to the second group of first ACTs into the first memory after the first row strobe unit writes the second group of first ACTs into the first memory. It can be seen that, in periodic intervals for writing, by the first read and write unit, adjacent operation commands that correspond to the first group of first ACTs into the first memory, not only the second row strobe unit writes the second ACTs into the second memory, but also the first row strobe unit may write another group of first ACTs into the first memory.

Preferably, the second row strobe unit is further configured to write the second ACTs into the second memory in periodic intervals for writing, by the first read and write unit, the operation commands that correspond to the second group of first ACTs into the first memory.

Preferably, the first group of first ACTs and the second group of first ACTs respectively contain four first ACTs.

Preferably, the second row strobe unit is further configured to write the first group of second ACTs into the second memory in periodic intervals for writing, by the first read and write unit, the operation commands that correspond to the first group of first ACTs into the first memory and/or in periodic intervals for writing, by the first read and write unit, the operation commands that correspond to the second group of first ACTs into the first memory, where the first group of second ACTs contains at least one second ACT.

It can be seen that, in this embodiment, periodic intervals for writing, by the first read and write unit, commands are utilized to write the second ACTs into the second memory. Furthermore, in periodic intervals for writing, by the first read and write unit, the operation commands that correspond to the first group and the second group of first ACTs, the first row strobe unit may further write the second group of first ACTs into the first memory. Therefore, the second row strobe unit also writes the first group of second ACTs into the first memory in periodic intervals for writing, by the first row strobe unit, the second group of first ACTs into the first memory. This further utilizes periodic intervals for writing, by the first read and write unit and the first row strobe unit, commands.

Preferably, the first group of second ACTs contains four second ACTs.

Preferably, the second read and write unit is further configured to write operation commands that correspond to the first group of second ACTs into the second memory after the first read and write unit writes the operation commands that correspond to the first group of first ACTs and the operation commands that correspond to the second group of first ACTs into the first memory. This step reduces command switching between different Ranks, and reduces an idle period brought by switching between different Ranks (Two periodic intervals are required for switching between different Ranks).

Preferably, the second read and write unit is further configured to write a second group of second ACTs into the second memory in periodic intervals for writing, by the second read and write unit, adjacent operation commands that correspond to the first group of second ACTs into the second memory, where the second group of second ACTs contains at least one second ACT. It can be seen that, periodic intervals of the operation commands that correspond to the first group of second ACTs are utilized.

Preferably, the second group of second ACTs contains four second ACTs.

Preferably, the second read and write unit is further configured to write operation commands that correspond to the second group of second ACTs into the second memory after writing the operation commands that correspond to the first group of second ACTs into the second memory.

Preferably, the first row strobe unit is further configured for the memory controller to write a third group of first ACTs into the first memory in periodic intervals for writing, by the second read and write unit, the operation commands that correspond to the first group of second ACTs into the second memory and/or in periodic intervals for writing, by the second read and write unit, the operation commands that correspond to the second group of second ACTs into the second memory, where the third group of first ACTs contains at least one first ACT.

Preferably, the third group of first ACTs includes four first ACTs.

An interval between the third group of first ACTs and the second group of first ACTs is larger than a tFAW.

It can be seen that, the first read and write unit utilizes an interval between the third group of first ACTs and the second group of first ACTs to write a command into the second memory, and at the same time, may still utilize periodic intervals of the operation commands that correspond to the first group and second group of second ACTs to write the third group of first ACTs.

Preferably, the first read and write unit is further configured to write operation commands that correspond to the third group of first ACTs into the first memory after the second read and write unit writes the operation commands that correspond to the second group of second ACTs into the second memory and after the first row strobe unit writes the third group of first ACTs into the first memory.

It can be seen that, the second read and write unit writes an operation command in a periodic interval for writing, by the first read and write unit, the operation commands that correspond to the second group of first ACTs and the operation commands that correspond to the third group of first ACTs. If the operation commands that correspond to the second group of first ACTs are write operation commands, and the operation commands that correspond to the third group of first ACTs are read operation commands, the second read and write unit writes an operation command into the second memory by making full use of an interval for write-to-read operation switching of the first read and write unit, eliminating an idle period of a tWTR and CL caused by the write-to-read operation of the first read and write unit.

Preferably, the second read and write unit is further configured to write the second group of second ACTs into different Banks of the second memory.

Preferably, the first read and write unit is further configured to write the third group of first ACTs into different Banks of the first memory.

Embodiment 8

Figure 11:
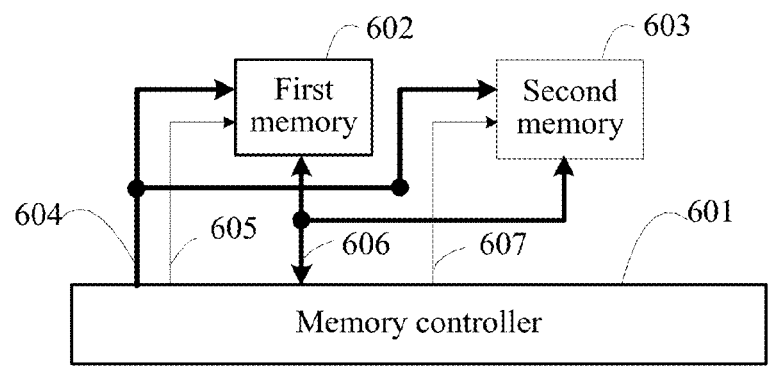
FIG. 11 is a logical structural diagram of a memory system.

As shown in FIG. 11, a memory system includes a memory controller 601 and a memory that includes a first memory 602 and a second memory 603. The memory controller is respectively connected through an address command ADDR/CMD bus 604 to the first memory 602 and the second memory 603, so that the first memory 602 and the second memory 603 perform time-division multiplexing on ADDR/CMD bus signals.

A chip selection CS end of the memory controller is respectively connected to a CS end of the first memory 602 and a CS end of the second memory 603. Specifically, a first CS end 605 of the memory controller is connected to the CS end of the first memory 602 and a second CS end 607 of the memory controller is connected to the CS end of the second memory 603, so that the memory controller 601 sends an independent chip selection signal respectively to the first memory 602 and the second memory 603.

A data and DQ606 of the memory controller is connected to a DQ end of the first memory 602 and a DQ end of the second memory 603 at the same time, and the memory controller 601 is configured with dual Ranks that are the first memory 602 and the second memory 603.

Preferably, the first memory and the second memory are X16 DDR3 SDRAMs.

Preferably, the first memory and the second memory are X16 DDR3 SDRAMs based on TSV or DDP.

The embodiments of the present invention can be combined with the prior art to improve bus utilization of a memory system.

Persons of ordinary skill in the art may understand that all or part of the steps of the methods in the foregoing embodiments may be completed by a program instructing relevant hardware. The program may be stored in a computer readable storage medium. The storage medium may include a ROM, a RAM, a magnetic disk, or an optical disk, and so on.

The foregoing detailed descriptions are about a memory scheduling method and a memory controller provided in the embodiments of the present invention. Specific examples are used to illustrate the principles and implementations manners of the present invention. The foregoing description about the embodiments is merely for understanding the methods and core ideas of the present invention. Meanwhile, persons of ordinary skill in the art may make modifications to the specific implementation manners and application scopes according to the idea of the present invention. In conclusion, the content of this specification should not be construed as a limitation to the present invention.

What is claimed is:

1. A memory scheduling method, comprising:
consecutively writing, by a memory controller, a first group of first row strobe commands (ACTs) into a first memory, wherein the first group of first ACTs comprises multiple first ACTs and wherein a periodic interval exists between adjacent first ACTs being written by the memory controller into the first memory;
writing, by the memory controller, operation commands that correspond to the first group of first ACTs into the first memory after consecutively writing the first group of first ACTs into the first memory, wherein a periodic interval exists between adjacent operation commands being written by the memory controller into the first memory;
writing, by the memory controller, second ACTs into a second memory during periodic intervals between adjacent first ACTs being written into the first memory and/or during periodic intervals between adjacent operation commands that correspond to the first group of first ACTs being written into the first memory; and
writing, by the memory controller, operation commands that correspond to the second ACTs into the second memory, wherein the first memory and the second memory are configured with dual Ranks.

2. The memory scheduling method according to claim 1, wherein the operation commands are read operation commands or write operation commands, wherein the read operation commands comprise read commands (RD) and read commands (RDAP) that have implicit row charging commands and wherein the write operation commands comprise write commands (WR) and write commands (WRAP) that have implicit row charging commands.

3. The memory scheduling method according to claim 2, wherein writing the first group of first ACTs into the first memory comprises writing the first ACTs into different banks of the first memory.

4. The memory scheduling method according to claim 2, wherein writing the second ACTs into the second memory comprises writing the second ACTs into different banks of the second memory.

5. The memory scheduling method according to claim 4, wherein:
writing the second ACTs into the second memory comprises writing the second ACTs into the second memory during periodic intervals between adjacent first ACTs being written into the first memory; and
writing the operation commands that correspond to the first group of first ACTs into the first memory comprises writing the operation commands that correspond to the first group of first ACTs into the first memory after writing the second ACTs into the second memory.

6. The memory scheduling method according to claim 5, wherein writing the operation commands that correspond to the first group of first ACTs into the first memory comprises:
writing, by the memory controller, write operation commands that correspond to the first group of first ACTs into the first memory; and
writing, by the memory controller, read operation commands that correspond to the first group of first ACTs into the first memory after writing the write operation commands that correspond to the first group of first ACTs into the first memory.

7. The memory scheduling method according to claim 6, wherein writing the operation commands that correspond to the second ACTs into the second memory further comprises, in periodic intervals for switching from writing the write operation commands that correspond to the first group of first ACTs into the first memory to writing the read operation commands that correspond to the first group of first ACTs, writing, by the memory controller, the operation commands that correspond to the second ACTs into the second memory.

8. The memory scheduling method according to claim 4, further comprising:
in periodic intervals between writing adjacent operation commands that correspond to the first group of first ACTs into the first memory, writing, by the memory controller, a second group of first ACTs into the first memory, wherein the second group of first ACTs comprises multiple first ACTs; and
after writing the second group of first ACTs into the first memory, writing, by the memory controller, operation commands that correspond to the second group of first ACTs into the first memory.

9. The memory scheduling method according to claim 8, wherein writing the second ACTs into the second memory further comprises, in periodic intervals between writing adjacent operation commands that correspond to the second group of first ACTs into the first memory, writing, by the memory controller, the second ACTs into the second memory.

10. The memory scheduling method according to claim 9, wherein the first group of first ACTs and the second group of first ACTs respectively contain four first ACTs.

11. The memory scheduling method according to claim 9, wherein writing the second ACTs into the second memory comprises, in periodic intervals between writing adjacent operation commands that correspond to the first group of first ACTs into the first memory and/or in periodic intervals between writing adjacent operation commands that correspond to the second group of first ACTs into the first memory, writing, by the memory controller, a first group of second ACTs into the second memory, and wherein the first group of second ACTs contains at least one second ACT.

12. The memory scheduling method according to claim 11, wherein writing the operation commands that correspond to the second ACTs into the second memory comprises, after writing the operation commands that correspond to the first group of first ACTs and the operation commands that correspond to the second group of first ACTs into the first memory, writing, by the memory controller, operation commands that correspond to the first group of second ACTs into the second memory.

13. The memory scheduling method according to claim 12, wherein the first group of second ACTs contains four second ACTs.

14. The memory scheduling method according to claim 12, further comprising writing, by the memory controller, a second group of second ACTs into the second memory in periodic intervals between writing adjacent operation commands that correspond to the first group of second ACTs into the second memory, wherein the second group of second ACTs contains at least one second ACT.

15. The memory scheduling method according to claim 14, wherein the second group of second ACTs contains four second ACTs.

16. The memory scheduling method according to claim 14, further comprising writing, by the memory controller, operation commands that correspond to the second group of second ACTs into the second memory after writing the operation commands that correspond to the first group of second ACTs into the second memory.

17. The memory scheduling method according to claim 16, further comprising writing, by the memory controller, a third group of first ACTs into the first memory in periodic intervals between writing adjacent operation commands that correspond to the first group of second ACTs into the second memory and/or in periodic intervals between writing adjacent operation commands that correspond to the second group of second ACTs into the second memory, wherein the third group of first ACTs contains at least one first ACT.

18. The memory scheduling method according to claim 17, wherein the third group of first ACTs contains four first ACT.

19. The memory scheduling method according to claim 17, further comprising writing, by the memory controller, operation commands that correspond to the third group of first ACTs into the first memory after writing the operation commands that correspond to the second group of second ACTs into the second memory and writing the third group of first ACTs into the first memory.

20. A memory controller, comprising:
a first row strobe circuit, configured to consecutively write a first group of first row strobe commands ACTs into a first memory, wherein the first group of first ACTs comprises multiple first ACTs and a periodic interval exists between adjacent first ACTs being written into the first memory;
a first read and write circuit, configured to write operation commands that correspond to the first group of first ACTs into the first memory after the first row strobe circuit consecutively writes the first group of first ACTs into the first memory, wherein a periodic interval exists between adjacent operation commands being written into the first memory;
a second row strobe circuit, configured to write second ACTs into a second memory in periodic intervals between writing, by the first row strobe circuit, adjacent first ACTs of the first group of first ACTs into the first memory and/or in periodic intervals between writing, by the first read and write circuit, adjacent operation commands that correspond to the first group of first ACTs into the first memory, wherein the first memory and the second memory are configured with dual Ranks; and a second read and write circuit, configured to write operation commands that correspond to the second ACTs into the second memory.

21. The memory controller according to claim 20, wherein the operation commands are read operation commands or write operation commands, wherein the read operation commands comprise read commands (RD) and read commands (RDAP) that have implicit row charging commands, and the write operation commands comprise write commands (WR) and write commands (WRAP) that have implicit row charging commands.

22. The memory controller according to claim 21, wherein the first read and write circuit is further configured to write the first ACTs into different banks Bank of the first memory.

23. The memory controller according to claim 21, wherein the second read and write circuit is further configured to write the second ACTs into different Banks of the second memory.

24. The memory controller according to claim 23, wherein:
the second row strobe circuit is further configured to write the second ACTs into the second memory in periodic intervals between writing, by the first row strobe circuit, adjacent first ACTs of the first group of first ACTs into the first memory; and
the first read and write circuit is further configured to write the operation commands that correspond to the first group of first ACTs into the first memory after the first row strobe circuit writes the first group of first ACTs into the first memory and the second row strobe circuit writes the second ACTs to the second memory.

25. The memory controller according to claim 24, wherein the first read and write circuit comprises a first read circuit and a first write circuit;
wherein the first write circuit is configured to write write operation commands that correspond to the first group of first ACTs into the first memory; and
wherein the first read circuit is configured to write read operation commands that correspond to the first group of first ACTs into the first memory after the first write circuit writes the write operation commands that correspond to the first group of first ACTs into the first memory.

26. The memory controller according to claim 25, wherein the second read and write circuit is further configured to write operation commands that correspond to the second ACTs into the second memory in periodic intervals between switching from the writing, by the first write circuit, the write operation commands that correspond to the first group of first ACTs into the first memory to the writing, by the first read circuit, the read operation commands that correspond to the first group of first ACTs into the first memory.

27. The memory controller according to claim 23, wherein:
the first row strobe circuit is further configured to write a second group of first ACTs into the first memory in periodic intervals between writing adjacent operation commands that correspond to the first group of first ACTs into the first memory, and the second group of first ACTs contains multiple first ACTs; and the first read and write circuit is further configured to write operation commands that correspond to the second group of first ACTs into the first memory after the first row strobe circuit writes the second group of first ACTs into the first memory.

28. The memory controller according to claim 27, wherein the second row strobe circuit is further configured to write the second ACTs into the second memory in periodic intervals between writing, by the first read and write circuit, adjacent operation commands that correspond to the second group of first ACTs into the first memory.

29. The memory controller according to claim 28, wherein the first group of first ACTs and the second group of first ACTs respectively contain four first ACTs.

30. The memory controller according to claim 28, wherein the second row strobe circuit is further configured to write a first group of second ACTs into the second memory in periodic intervals between writing, by the first read and write circuit, adjacent operation commands that correspond to the first group of first ACTs into the first memory and/or in periodic intervals between writing, by the first read and write circuit, adjacent operation commands that correspond to the second group of first ACTs into the first memory, and the first group of second ACTs contains at least one second ACT.

31. The memory controller according to claim 30, wherein the second read and write circuit is further configured to write operation commands that correspond to the first group of second ACTs into the second memory after the first read and write circuit writes the operation commands that correspond to the first group of first ACTs and the operation commands that correspond to the second group of first ACTs into the first memory.

32. The memory controller according to claim 31, wherein the first group of second ACTs contains four second ACTs.

33. The memory controller according to claim 31, wherein the second row strobe circuit is further configured to write a second group of second ACTs into the second memory in periodic intervals between writing, by the second read and write circuit, adjacent operation commands that correspond to the first group of second ACTs into the second memory, and the second group of second ACTs contains at least one second ACT.

34. The memory controller according to claim 33, wherein the second group of second ACTs contains four second ACTs.

35. The memory controller according to claim 33, wherein the second read and write circuit is further configured to write operation commands that correspond to the second group of second ACTs into the second memory after writing the operation commands that correspond to the first group of second ACTs into the second memory.

36. The memory controller according to claim 35, wherein the first row strobe circuit is further configured for the memory controller to write a third group of first ACTs into the first memory in periodic intervals writing, by the second read and write circuit, adjacent operation commands that correspond to the first group of second ACTs into the second memory and/or in periodic intervals between writing, by the second read and write circuit, adjacent operation commands that correspond to the second group of second ACTs into the second memory, and the third group of first ACTs contains at least one first ACT.

37. The memory controller according to claim 36, wherein the third group of first ACTs comprises four first ACTs.

38. The memory controller according to claim 36, wherein the first read and write circuit is further configured to write operation commands that correspond to the third group of first ACTs into the first memory after the second read and write writes the operation commands that correspond to the second group of second ACTs into the second memory and the first row strobe circuit writes the third group of first ACTs into the first memory.

* * * * *